(12) United States Patent
Dimitrakopoulos et al.

(10) Patent No.: US 8,685,844 B2
(45) Date of Patent: Apr. 1, 2014

(54) SUB-10 NM GRAPHENE NANORIBBON LATTICES

(75) Inventors: Christos D. Dimitrakopoulos, Baldwin Place, NY (US); Aaron D. Franklin, Croton on Hudson, NY (US); Joshua T. Smith, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/586,527

(22) Filed: Aug. 15, 2012

(65) Prior Publication Data

US 2014/0051229 A1    Feb. 20, 2014

(51) Int. Cl.
*H01L 21/20*    (2006.01)
*H01L 21/36*    (2006.01)

(52) U.S. Cl.
USPC ............. 438/507; 257/E21.09; 257/E21.257; 438/455; 438/458; 438/478; 438/689; 438/694; 977/734; 977/762; 977/888

(58) Field of Classification Search
USPC ............. 257/E21.09, E21.257; 438/455, 458, 438/478, 507, 689, 694; 977/734, 762, 888
See application file for complete search history.

(56) References Cited

U.S. PATENT DOCUMENTS

| 7,267,859 | B1 | 9/2007 | Rabin et al. |
|---|---|---|---|
| 2005/0079282 | A1 | 4/2005 | Jin |
| 2009/0087664 | A1 | 4/2009 | Nealey et al. |
| 2009/0266418 | A1 | 10/2009 | Hu et al. |
| 2010/0012180 | A1 | 1/2010 | Day et al. |
| 2010/0295023 | A1 | 11/2010 | Franklin et al. |
| 2010/0327956 | A1 | 12/2010 | Kaerkkaeinen et al. |
| 2011/0059599 | A1 | 3/2011 | Ward et al. |
| 2011/0201201 | A1 | 8/2011 | Arnold et al. |
| 2011/0253969 | A1 | 10/2011 | Dai et al. |
| 2012/0193610 | A1 | 8/2012 | Kim |

OTHER PUBLICATIONS

Han, M. Y., et al., "Energy Band-Gap Engineering of Graphene Nanoribbons", Physical Review Letters, PRL 98, 206805, week ending May 18, 2007.
Chen, Z., et al., "Graphene nano-ribbon electronics", Science Direct, Physica E 40, Jun. 2007, pp. 228-232.
Li, X., et al., "Chemically Derived, Ultrasmooth Graphene Nanoribbon Semiconductors", Science, Feb. 29, 2008, vol. 319, pp. 1229-1232.
Jiao, L., et al., "Narrow graphene nanoribbons from carbon nanotubes", Letters, Nature, Apr. 16, 2009, vol. 458, pp. 877-880.
Kosynkin, D. V., et al., "Longitudinal unzipping of carbon nanotubes to form graphene nanoribbons", Letters, Nature, Apr. 2009, vol. 458, pp. 872-876.

(Continued)

*Primary Examiner* — Asok K Sarkar
(74) *Attorney, Agent, or Firm* — Scully, Scott, Murphy & Presser, P.C.; Louis J. Percello, Esq.

(57) ABSTRACT

A graphene lattice comprising an ordered array of graphene nanoribbons is provided in which each graphene nanoribbon in the ordered array has a width that is less than 10 nm. The graphene lattice including the ordered array of graphene nanoribbons is formed by utilizing a layer of porous anodized alumina as a template which includes dense alumina portions and adjacent amorphous alumina portions. The amorphous alumina portions are removed and the remaining dense alumina portions which have an ordered lattice arrangement are employed as an etch mask. After removing the amorphous alumina portions, each dense alumina portion has a width which is also less than 10 nm.

12 Claims, 8 Drawing Sheets

(56) References Cited

OTHER PUBLICATIONS

Bai, J., et al., "Rational Fabrication of Graphene Nanoribbons Using a Nanowire Etch Mask", NANO Letters Apr. 2009, vol. 9, No. 5, pp. 2083-2087.

Bai, J., et al., "Graphene nanomesh", Nature Nanotechnology, Letters, Published Online: Feb. 14, 2010, vol. 5.

Masuda, H., et al., "Square and Triangular Nanohole Array Architectures in Anodic Alumina", Adv. Mater., Feb. 5, 2001,13, No. 3.

Nielsch, K., et al., "Self-ordering Regimes of Porous Alumina: The 10% Porosity Rule", Nano Letters, vol. 2, No. 7, Jul. 2002.

Smith, J. T., et al., "Highly ordered diamond and hybrid triangle-diamond patterns in porous anodic alumina thin films", Applied Physics Letters, Jul. 2008 93, 043108.

Lei, Y., et al., "Highly ordered nanostructures with tunable size, shape and properties: A new way to surface nano-patterning using ultra-thin alumina masks", Progress in Materials Science 52 (2007) 465-539.

Notice of Allowance dated Dec. 6, 2013 received in a related U.S. Patent Application, U.S. Appl. No. 13/607,688.

US 8,685,844 B2

SUB-10 NM GRAPHENE NANORIBBON LATTICES

BACKGROUND

The present disclosure relates to semiconductor device manufacturing, and more particular to methods of forming graphene lattices that include an ordered array of graphene nanoribbons, wherein each nanoribbon in the ordered array has a uniform sub-10 nm width. The present disclosure also relates to a semiconductor structure including such an ordered array of graphene nanoribbons.

Several trends presently exist in the semiconductor and electronics industry including, for example, devices are being fabricated that are smaller, faster and require less power than the previous generations of devices. One reason for these trends is that personal devices such as, for example, cellular phones and personal computing devices, are being fabricated that are smaller and more portable. In addition to being smaller and more portable, personal devices also require increased memory, more computational power and speed. In view of these ongoing trends, there is an increased demand in the industry for smaller and faster transistors used to provide the core functionality of the integrated circuits used in these devices.

Accordingly, in the semiconductor industry there is a continuing trend toward fabricating integrated circuits (ICs) with higher densities. To achieve higher densities, there has been, and continues to be, efforts toward down scaling the dimensions of the devices on semiconductor wafers generally produced from bulk silicon. These trends are pushing the current technology to its limits. In order to accomplish these trends, high densities, smaller feature sizes, smaller separations between features, and more precise feature shapes are required in integrated circuits (ICs).

Significant resources go into down scaling the dimensions of devices and increasing packing densities. For example, significant time may be required to design such down scaled transistors. Moreover, the equipment necessary to produce such devices may be expensive and/or processes related to producing such devices may have to be tightly controlled and/or be operated under specific conditions. Accordingly, there are significant costs associated with exercising quality control over semiconductor fabrication.

In view of the above, the semiconductor industry is pursuing graphene to achieve some of the aforementioned goals. Graphene, which is essentially a flat sheet of carbon atoms, is a promising material for radio frequency (RF) transistors and other electronic transistors. In order for graphene to be considered as a viable candidate for scaled semiconductor devices, particularly for digital circuits, there exists a need for providing a graphene lattice including an ordered array of graphene nanoribbons having sub-10 nm widths thereby opening up a significant bandgap to realize a suitable on-off current ratio.

SUMMARY

A graphene lattice comprising an ordered array of graphene nanoribbons is provided in which each graphene nanoribbon in the ordered array has a width that is less than 10 nm. By "ordered array" it is meant the graphene nanoribbons have a well defined repeating pattern associated therewith. The graphene lattice including the ordered array of graphene nanoribbons is formed by utilizing a layer of porous anodized alumina as a template which includes dense alumina portions and adjacent amorphous alumina portions. The amorphous alumina portions are removed and the remaining dense alumina portions which have an ordered lattice arrangement are employed as an etch mask. After removing the amorphous alumina portions, each dense alumina portion has a width which is also less than 10 nm.

In one aspect of the present disclosure, a method of forming a semiconductor structure is provided. In this aspect of the present disclosure, the method includes forming a blanket layer of graphene on an exposed surface of a copper substrate. A blanket layer of aluminum is then formed on an exposed surface of the blanket layer of graphene. In some embodiments, an adhesion or seed layer, for example titanium oxide, can be formed on the exposed surface of the blanket layer of graphene prior to forming the blanket layer of aluminum. Next, the blanket layer of aluminum is pre-patterned to form a plurality of regularly spaced pits within the blanket layer of aluminum. The pre-patterned blanket layer of aluminum having the plurality of regularly spaced pits is then converted into a layer of porous anodized alumina. The layer of porous anodized alumina that is formed by this converting comprises a plurality of alumina portions of a first density and having an ordered lattice arrangement (i.e., well defined repeating pattern), and amorphous alumina portions of second density that are adjacent to the plurality of alumina portions. In accordance with an aspect of the present disclosure, the first density of the plurality of alumina portions is greater than the second density of the adjacent amorphous alumina portions. Next, the adjacent amorphous alumina portions are removed from the layer of porous anodized alumina. At this point of the present disclosure, each alumina portion of the first density has a width of less than 10 nm. Exposed portions of the blanket layer of graphene are then removed using the plurality of alumina portions as an etch mask to provide a graphene lattice comprising an ordered array of graphene nanoribbons, each graphene nanoribbon within the ordered array has a width of less than 10 nm. Next, the etch mask is removed and the remaining graphene lattice including the ordered array of graphene nanoribbons is transferred to a substrate.

In another aspect of the present disclosure, a method of forming a semiconductor structure is provided. In this another aspect of the present disclosure, the method includes providing a structure comprising, from bottom to top, a blanket layer of silicon carbide, a blanket layer of titanium located on an exposed surface of the blanket layer of silicon carbide, and a blanket layer of aluminum located on an exposed surface of the blanket layer of titanium. Next, the blanket layer of aluminum is pre-patterned to form a plurality of regularly spaced pits within the blanket layer of aluminum. The pre-patterned blanket layer of aluminum having the plurality of regularly spaced pits is then converted into a layer of porous anodized alumina. The layer of porous anodized alumina that is formed by this converting comprises a plurality of alumina portions of a first density and having an ordered lattice arrangement, and amorphous alumina portions of a second density that are adjacent to the plurality of alumina portions. In accordance with an aspect of the present disclosure, the first density of the plurality of alumina portions is greater than the second density of the adjacent amorphous alumina portions. Next, the adjacent amorphous alumina portions are removed from the layer of porous anodized alumina. At this point of the present disclosure, each alumina portion of the first density has a width of less than 10 nm. Exposed portions of the blanket layer of titanium and underlying portions of the blanker layer of silicon carbide are then removed using the plurality of alumina portions as an etch mask to provide an ordered array of silicon carbide portions, each silicon carbide portion of the ordered array of silicon carbide portions has a width of less than 10 nm. The etch mask and remaining portions of the blanket layer of titanium are removed. Next, a layer of graphene is formed on all exposed surfaces of each silicon carbide portion. In accordance with the present disclosure each layer of graphene has a width of less than 10 nm. In this embodiment, each layer of graphene forms a graphene nanoribbon.

In yet another aspect of the present disclosure, a semiconductor structure is provided. The semiconductor structure that is provided in the present disclosure includes a graphene lattice comprising an ordered array of graphene nanoribbons located on a surface of a substrate, wherein each graphene nanoribbon of the ordered array of graphene nanoribbons has a width of less than 10 nm.

In a further embodiment of the present disclosure, another semiconductor structure is provided. The semiconductor structure of this further embodiment includes an ordered array (well defined repeating pattern) of silicon carbide portions located on a surface of a substrate. Each silicon carbide portion of the ordered array of silicon carbide portions has a width which is less than 10 nm. The structure also includes at least a layer of graphene located on a topmost surface of each of the silicon carbide portions. Each layer of graphene has a width of less than 10 nm. In this embodiment, each layer of graphene is representative of a graphene nanoribbon within an ordered array of graphene nanoribbons.

DETAILED DESCRIPTION

Figure 1:
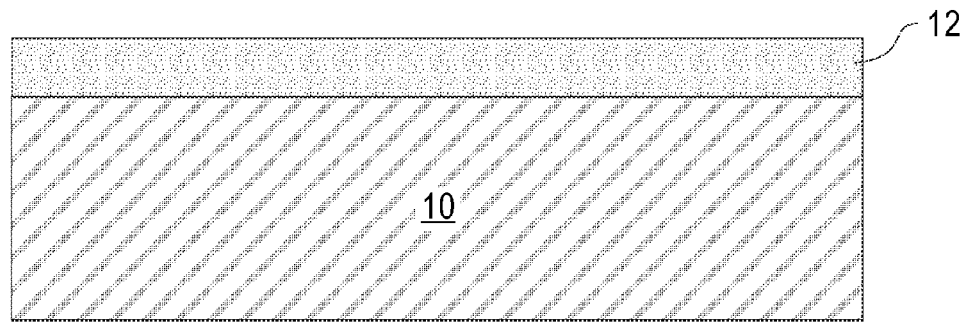
FIG. 1 is a pictorial representation (through a cross sectional view) illustrating a structure including a blanket layer of graphene formed on an exposed surface of a copper substrate that can be employed in one embodiment of the present disclosure.

The present disclosure, which provides highly ordered, sub-10 nm graphene lattice structures and methods of forming the same, will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present invention. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

In order for graphene to be considered as technology relevant material for digital applications, the graphene must be trimmed in some fashion into nanoribbons with sub-10 nm widths thereby opening up a significant bandgap to realize a suitable on-off current ratio. Highly accurate and reproducible definition of the nanoribbon widths in this sub-10 nm regime is a key to produce reliable nanoelectronic devices from graphene. The primary problem with existing graphene structures, such as graphene nanoribbons or nanomesh, tailored to accomplish this task is that they result in an unacceptable statistical variability in ribbon width when the devices are scaled aggressively since the bandgap is inversely proportional to the ribbon width in this regime. Ultimately, a densely packed graphene lattice structure with periodic patterning would provide a suitable means of enabling both small reproducible features to enable a suitable bandgap and a higher current drive—two features that are highly desirable for nanoelectronic devices, e.g., a graphene based field effect transistor (FET).

To date, graphene nanoribbons and nanomesh are the two most prominent and effective examples for the successful creation of a bandgap at room temperature in graphene. Graphene nanoribbons have been produced using different approaches. In a broad sense, the primary problems with currently conceived methods to create individual graphene nanoribbons are low drive current, or conductance, coupled with a tradeoff between reaching the sub-10 nm regime and overcoming the placement problem.

Accordingly, the present disclosure creates highly-ordered graphene lattices which contain sub-10 nm graphene nanoribbons. Hexagonal, square and triangular as well as hybridized lattice arrangements of nanoribbons can be formed by using one of the methods of the present disclosure. By "hybridized lattice arrangements" it is meant lattices containing arrangements of at least one of the aforementioned shapes as well as diamond shapes. The graphene lattices that can be obtained in the present disclosure have independently tunable periodicity and ribbon widths with a narrow distribution. By "narrow distribution" it is meant ±1 nm. The graphene nanoribbons within the graphene lattice structure of the present disclosure promote high current levels and throughput, controllable bandgap formation and a variety of possible lattice arrangements with sub-10 nm features that potentially may give rise to unique properties, lending the graphene lattice structures of the present disclosure to a broad range of nanoelectronic applications. These sub-10 nm lattice structures are not possible utilizing any of the prior art techniques.

Reference is now made to FIGS. 1-8 which illustrate one embodiment of the present disclosure for forming a semiconductor structure including an ordered array of sub-10 nm graphene nanoribbons. Specifically, this embodiment of the present disclosure provides a graphene lattice comprising an ordered array of graphene nanoribbons located on a surface of a substrate, wherein each graphene nanoribbon of the ordered array of graphene nanoribbons has a width which is less than 10 nm.

Each graphene nanoribbon of the ordered array of graphene nanoribbons comprises graphene. The term "graphene" as used throughout the present disclosure denotes a one-atom-thick planar sheet of $sp^2$-bonded carbon atoms that are densely packed in a honeycomb crystal lattice. The graphene employed in the present disclosure has a two-dimensional (2D) hexagonal crystallographic bonding structure.

Reference is first made to FIG. 1, which illustrates a structure including a blanket layer of graphene 12 formed on an exposed surface of a copper substrate 10 that can be employed in one embodiment of the present disclosure.

The copper substrate 10 that can be employed in the present disclosure can be a copper foil that can be optionally present on another substrate (not shown in the drawing). The another substrate that is not shown in the drawings can be any semiconductor material, dielectric material, conductive material, or any multilayered stack thereof.

The copper substrate 10 can be formed utilizing any deposition process well known to those skilled in the art. For example, a copper substrate 10 can be formed by chemical vapor deposition, plasma enhanced chemical vapor deposition, physical vapor deposition, sputtering, plating, chemical solution deposition and electroless plating. Typically, copper foils are formed by sputtering a copper foil from a copper-containing target.

In one embodiment, the copper substrate 10 has a thickness from 7 μm to 25 μm. In another embodiment, the copper substrate 10 has a thickness from 20 μm to 30 μm. Other thicknesses for the copper substrate 10 that are above and/or below the thickness ranges mentioned above can also be used in the present disclosure.

The blanket layer of graphene 12 is a contiguous layer of graphene that can be comprised of single-layer graphene (nominally 0.34 nm thick), few-layer graphene (2-10 graphene layers), multi-layer graphene (>10 graphene layers), a mixture of single-layer, few-layer, and multi-layer graphene, or any combination of graphene layers mixed with amorphous and/or disordered carbon phases that result by graphene formation at lower temperatures (between 200° C. and 900° C.). The blanket layer of graphene 12 can also include, if desired, substitutional (where C atoms in graphene are replaced with dopant atoms covalently bonded to next nearest neighbor, nnn, atoms), and dopant atoms or molecules that do not form covalent bonds to graphene and lie on top of the graphene layer or between graphene layers in the case few layer or multilayer intercalated graphene. Typically, the blanket layer of graphene that is formed on the copper substrate 10 is single-layer graphene.

The blanket layer of graphene 12 can be formed utilizing a deposition process such as, for example, chemical vapor deposition (CVD), plasma enhanced chemical vapor deposition (PECVD), and ultraviolet (UV) assisted CVD. In one embodiment, the blanket layer of graphene is formed by CVD. The deposition process that can be employed in the present disclosure, which may be referred as a selective deposition process or a catalytic growth process, is initiated on the exposed surfaces of the copper substrate 10. In one embodiment, the deposition of the blanket layer of graphene 12 on the exposed surface of the copper substrate 10 can be performed at a temperature up to, but not exceeding, 500° C. for PECVD. In another embodiment, the growth of graphene occurs at a temperature from 800° C. to 1080° C. The deposition process that can be used in the present disclosure for forming the blanket layer of graphene includes utilizing any known carbon sources including, for example, benzene, propane, ethane and other hydrocarbons, and other carbon-containing gases.

In one embodiment of the present disclosure, the blanket layer of graphene 12 can have a thickness from 0.34 nm to 0.8 nm. In another embodiment, the blanket layer of graphene 12 can have a thickness from 0.7 nm to 3.4 nm. The blanket layer of graphene 12 can have other thicknesses that are above the ranges mentioned above.

Figure 2:
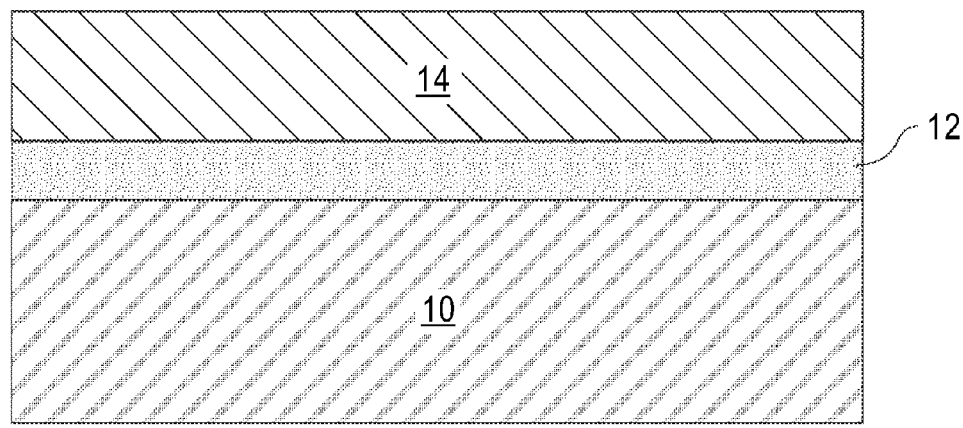
FIG. 2 is a pictorial representation (through a cross sectional view) illustrating the structure of FIG. 1 after forming a blanket layer of aluminum on an exposed surface of the blanket layer of graphene.

Referring to FIG. 2, there is depicted the structure of FIG. 1 after forming a blanket layer of aluminum 14 on an exposed surface of the blanket layer of graphene 12. The blanket layer of aluminum 14 can be formed utilizing any conventional deposition process. Examples of deposition processes that can be used in the present disclosure include, but are not limited to, chemical vapor deposition, atomic layer deposition, plasma enhanced chemical vapor deposition, physical vapor deposition, sputtering, plating, chemical solution deposition and electroless plating. In one embodiment, atomic layer deposition is used to provide a blanket layer of aluminum that has a surface roughness of about 20 nm RMS or less.

In one embodiment, the blanket layer of aluminum 14 that can be employed in the present disclosure has a thickness from 50 nm to 500 nm. In another embodiment, the blanket layer of aluminum 14 can have a thickness from 100 nm to 1000 nm. The blanket layer of aluminum 14 can have other thicknesses that are above or below the ranges mentioned above.

In some embodiments of the present disclosure (not shown), an adhesion or seed layer, for example, titanium oxide, is formed between the blanket layer of graphene and the blanket layer of aluminum. When present, the adhesion or seed layer can be formed by a deposition process. Suitable deposition processes that can be used in the present disclosure to form the adhesion or seed layer include, but are not limited to, chemical vapor deposition, atomic layer deposition plasma enhanced chemical vapor deposition, physical vapor deposition, sputtering, plating, chemical solution deposition and electroless plating. In one embodiment, the adhesion or seed layer hat can be employed in the present disclosure has a thickness from 3 nm to 10 nm. In another embodiment, the adhesion or seed layer can have a thickness from 5 nm to 50 nm.

Figure 3:
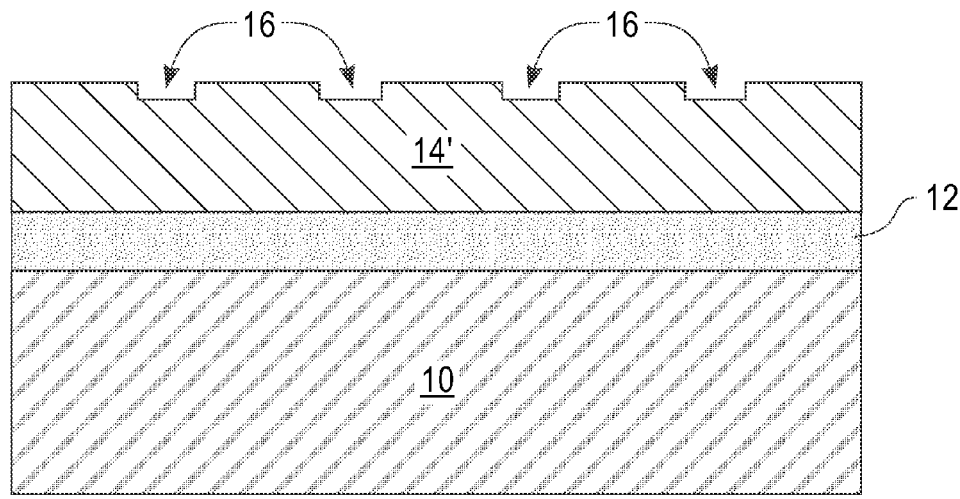
FIG. 3 is a pictorial representation (through a cross sectional view) illustrating the structure of FIG. 2 after pre-patterning the blanket layer of aluminum to form pits within the blanket layer of aluminum that have a desired lattice periodicity.

Referring now to FIG. 3, there is illustrated the structure of FIG. 2 after pre-patterning the blanket layer of aluminum 12 to form a pre-patterned blanket layer of aluminum 14' that has pits 16 formed therein that have a desired lattice periodicity, i.e., spacing between pits. That is, FIG. 3 illustrates the structure of FIG. 2 after forming a plurality of regularly spaced pits 16 within the blanket layer of aluminum 14. The regularly spaced apart pits 16 serve as initiation sites for pore generation at the initial stage of a subsequently performed anozidation process.

In one embodiment of the present disclosure, the pre-patterned blanket layer of aluminum 14' including the plurality of regular spaced apart pits 16 can be formed by nanoimprintation. Nanoimprintation is a low cost, high throughput and high resolution nanolithography process in which patterns can be created into the blanket layer of aluminum 14 by indentation using an imprint resist or mold.

In another embodiment, the pre-patterned blanket layer of aluminum 14' including the plurality of regular spaced apart pits 16 can be formed by interference lithography followed by an aluminum etch. Interference lithography is a technique for patterning regular arrays of fine features, without the use of complex optical systems or photomasks. It such a process, an interference pattern between two or more coherent light waves is set up and recorded in a photoresist layer. The photoresist layer (not shown) is formed atop the blanket layer of aluminum 14 utilizing conventional deposition process such as spin-on coating. The interference pattern consists of a periodic series of fringes representing intensity minima and maxima. Upon post-exposure photolithographic processing, a photoresist pattern corresponding to the periodic intensity pattern emerges. For 2-beam interference, the fringe-to-fringe spacing or period is given by $(\lambda/2)/\sin(\theta/2)$, where $\lambda$ is the wavelength and $\theta$ is the angle between the two interfering waves. The minimum period achievable is then half the wavelength. By using 3-beam interference, arrays with hexagonal symmetry can be generated, while with 4 beams, arrays with rectangular symmetry are generated. Hence, by superimposing different beam combinations, different patterns are made possible. The aluminum etch that follows the interference lithographic includes an etchant the selectively removes exposed portions of the blanket layer of aluminum 14 relative to the patterned photoresist. In one embodiment, the etchant that forms the pits 16 into the blanket layer of aluminum 14 comprises Aluminum Etchant Type A from Transene Company, Inc. After etching, the patterned resist can be removed by a conventional resist stripping process such as, for example, ashing.

Figure 4:
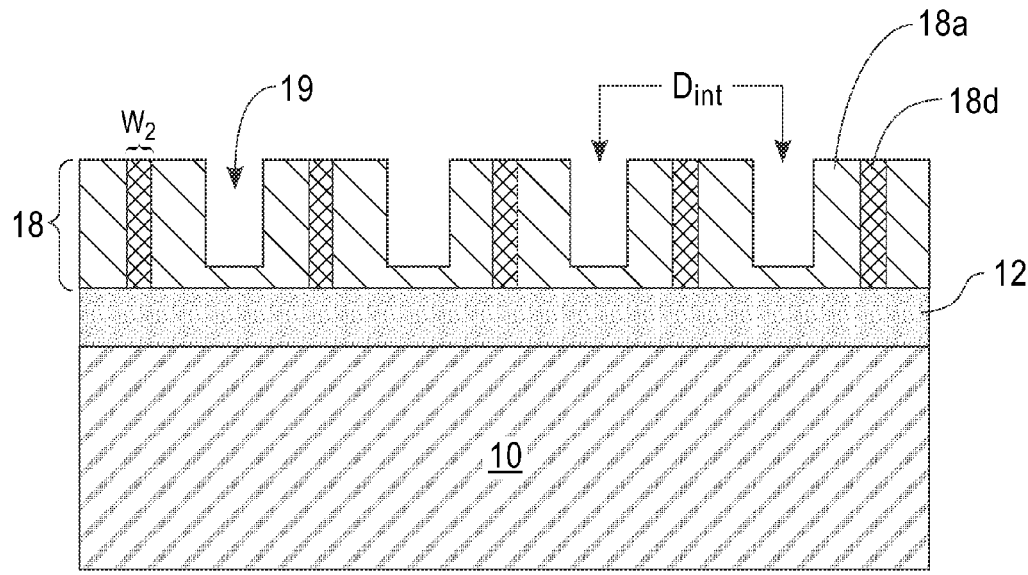
FIG. 4 is a pictorial representation (though a cross sectional view) illustrating the structure of FIG. 3 after converting the pre-patterned blanket layer of aluminum into a layer of porous anodized alumina.

Referring to FIG. 4, there is illustrated the structure of FIG. 3 after converting the pre-patterned blanket layer of aluminum 14' into a layer of porous anodized alumina 18. The converting is performed utilizing an Al anodization process. The layer of porous anodized alumina 18 comprises a plurality of pores 19 which are surrounded by two distinct oxides of aluminum.

Specifically, the two distinct oxides of aluminum which surround each pore include an outer cell wall portion that is comprised of amorphous alumina and an inner cell wall portion that is comprised of dense alumina portions that is mechanically compressed by the competing expansion of adjacent pores 19. In particular, the layer of porous anodized alumina 18 that is formed comprises a plurality of alumina portions 18d (hereinafter referred to as dense alumina portions 18d) of a first density and having an ordered lattice arrangement, and amorphous alumina portions of a second density which are adjacent to the dense alumina portions 18d. The amorphous alumina portions 18a are positioned between the pores 19 and the dense alumina portions 18d. In accordance with the present disclosure, the first density of the dense alumina portions 18d is greater than the second density of the amorphous alumina portions 18a.

The plurality of pores 19 are spaced apart by an equal interpore distance, $D_{int}$. The interpore distance is the distance measure from a center of one pore to a center of a nearest neighboring pore. The interpore distance is dependent on the conditions used to during the anozidation process. In one embodiment, the interpore distance can be from 45 nm to 100 nm. In another embodiment, the interpore distance can be from 100 nm to 200 nm. In yet a further embodiment, the intepore distance can be from 200 nm to 500 nm.

Each pore 19 that is formed has a characteristic shape which is dependent on the anodization conditions employed. In one embodiment, each pore 19 has a circular shape; circular shaped pores typically provide hexagonal lattices. In another embodiment, each pore 19 has a square shape. In yet another embodiment, each pore has a triangular shape. Also, and in yet other embodiments of the present disclosure, each pore 19 has a diamond shape. The shape of the pores 19 and the lattice arrangement of the dense alumina portions 18d within the porous anodized alumina layer 18 are dictated by the positioning of the pits 16 formed in the pre-patterned blanket layer of aluminum 14'. The lattice arrangement of the subsequently formed graphene nanoribbons are in turn dictated by the lattice arrangement of the dense alumina portions 18d within the porous anodized alumina layer 18. The pores 19 that are formed can have a porosity from 8 to 12%.

In one embodiment, each dense alumina portion 18d has a width, $w_1$, of less than 10 nm. In another embodiment, each dense alumina portion 19d has a width, $w_1$, from 7 nm to 55 nm.

As mentioned above, the pre-patterned blanket layer of alumina 14' is converted into the layer of porous anodized alumina 18 utilizing an aluminum anodization process which oxidizes the blanket layer of aluminum 14. In this embodiment of the present disclosure, the blanket layer of graphene 12 and copper substrate 10 serve as an electrode in the anodization process. The anodization process that can be used in present disclosures includes a bath containing an electrolyte. The structure shown in FIG. 2 is immersed in the bath and a potential is applied at an anozidation temperature. The other electrode of the anozidation process can be added to the bath prior to anozidation.

The electrolyte includes any acid that is capable of oxidizing aluminum. Examples of suitable electrolytes that can be used in the present disclosure include, but are not limited to, sulfuric acid, oxalic acid, phosphoric acid, gylolic acid, tartaric acid, malic acid and citric acid.

The concentration of the acid within the bath varies depending on the type of acid employed. In one embodiment, the concentration of acid within the bath can be from 0.1 to 15 volume % of the total bath, the remaining portion of the bath may include water. In another embodiment of the present disclosure, the concentration of acid within the bath can be from 0.2 to 12 volume % of the total bath, the remaining portion of the bath may include water.

The applied potential that can be used during anozidation can vary depending on the type of acid employed. Typically, the applied potential ranges from 8 Volts to 500 Volts. In one embodiment, the applied potential that can be used during the anozidation process is from 8 Volts to 45 Volts. In another embodiment, the applied potential that can be used during the anozidation process is from 40 Volts to 100 Volts. In yet another embodiment, the applied potential that can be used during the anozidation process is from 80 Volts to 500 Volts.

The anozidation temperature that can be employed during the anozidation process can also be varied. In one embodiment, the anozidation temperature can be from 250° Kelvin to 300° Kelvin. In another embodiment, the anozidation temperature can be from 270° Kelvin to 298° Kelvin.

The following table provides some exemplary conditions that can be used during the anozidation process.

TABLE 1

Exemplary Anozidation Conditions

| Electrolyte | Electrolyte Concentration (volume %) | Potential Range (Volts) | Temperatures (K) |
|---|---|---|---|
| Sulfuric acid | 5-10 | 8-70 | 273-288 |
| Oxalic acid | 0.25-3.0 | 40-160 | 274-288 |
| Phosphoric acid | 1-10 | 60-235 | 273-277 |
| Glycolic acid | 1-10 | 60-150 | 283-293 |
| Tartaric acid | 2-4 | 235-240 | 278 |
| Malic acid | 2-4 | 220-450 | 283-293 |
| Citric acid | 2-4 | 270-370 | 293 |

Figure 5:
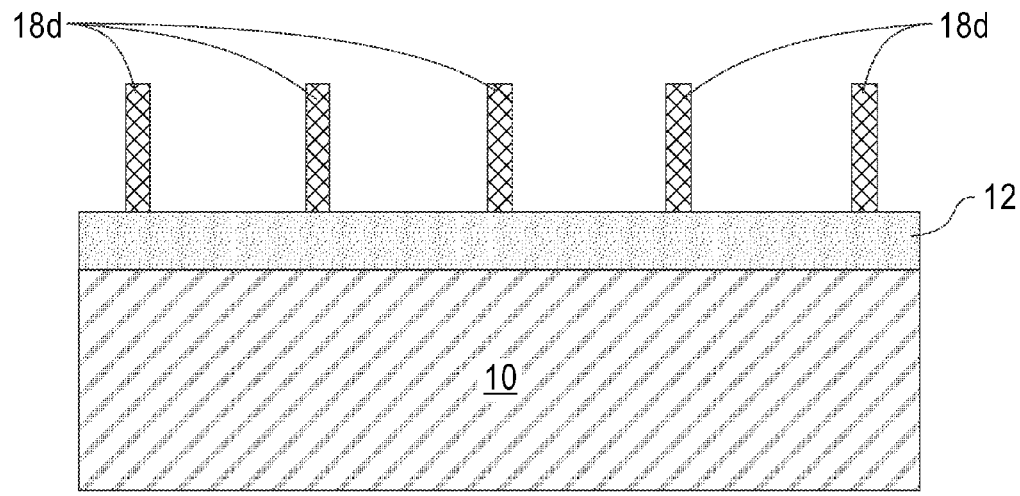
FIG. 5 is a pictorial representation (through a cross sectional view) illustrating the structure of FIG. 4 after removing amorphous portions of the layer of porous anodized alumina, while maintaining dense alumina portions that have a sub-10 nm width.

Referring now to FIG. 5, there is illustrated the structure of FIG. 4 after removing the amorphous alumina portions 18a of the layer of porous anodized alumina 18, while maintaining the dense alumina portions 18d. In some embodiments, the dense alumina portions can have a sub-10 nm width at this point of the present disclosure, in other embodiments, the sub-10 nm width of the dense alumina portions 18d occurs during the removal of the amorphous alumina portions from the layer of porous anodized alumina. Moreover, the remaining dense alumina portions 18d of the layer of porous anodized alumina have the ordered lattice arrangement provided by the pores 19 previously formed into the pre-patterned blanket layer of aluminum 14'.

The selective removal of the amorphous alumina portions 18a can be performed utilizing a chemical wet etching process in which an acid is used as the etchant. In one embodiment, the etchant can be dilute phosphoric acid. In another embodiment, the etchant can be dilute chromic acid. In some embodiments, the width of each of the remaining dense alumina portions 18d can be thinned at this point of the present disclosure to a range that is sub-10 nm.

Figure 6:
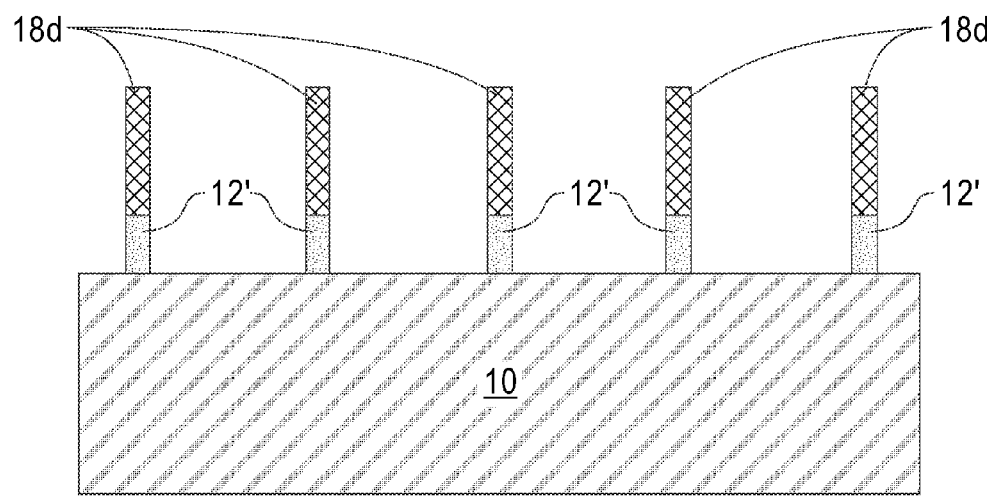
FIG. 6 is a pictorial representation (through a cross sectional view) illustrating the structure of FIG. 5 after etching portions of the blanket layer of graphene using the dense alumina portions of the layer of porous anodized alumina as an etch mask.

Referring now to FIG. 6, there is illustrated the structure of FIG. 5 after etching portions of the blanket layer of graphene 12 using the dense alumina portions 18d of the layer of porous anodized alumina 18 as an etch mask. That is, exposed portions of the blanket layer of graphene 12 which are not protected by the remaining dense alumina portions 18d are removed providing graphene nanoribbons 12' located beneath the remaining dense alumina portions 18d. In one embodiment, the removal of the exposed portions of the blanket layer of graphene 12 can be performed utilizing oxygen plasma etching. This process provides a graphene lattice comprising an ordered array of graphene nanoribbons that have the same lattice arrangement as that of the overlying dense alumina portions 18d. Moreover, each graphene nanoribbon 12' within the ordered array of graphene nanoribbons has a width which is below 10 nm. Typically, the width of each graphene nanoribbon 12' that is formed is from 4 nm to 9 nm. In some embodiments, each graphene nanoribbon can have a same sub-10 nm width.

Figure 7:
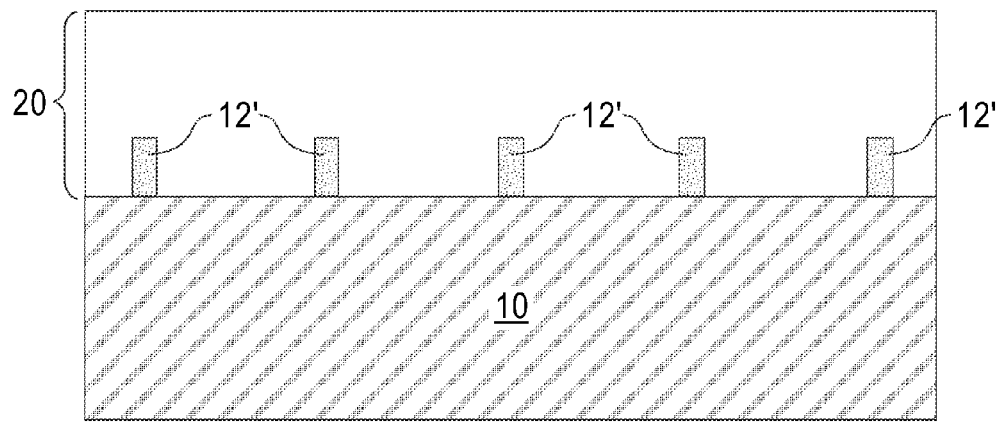
FIG. 7 is a pictorial representation (through a cross sectional view) illustrating the structure of FIG. 6 after removing the dense alumina portions of the layer of porous anodized alumina and application of a handle substrate thereto.

Referring now to FIG. 7, there is illustrated the structure of FIG. 6 after removing the dense alumina portions 18d of the layer of porous anodized alumina 18 and application of a handle substrate 20 to the surface of the copper substrate 10 which contains the graphene nanoribbons 12'. The dense alumina portions 18d can be removed by utilizing a wet etch process in which a chemical etchant that selectively removes the dense alumina portions 18d relative to the underlying graphene layer and copper substrate 10 is employed. In one embodiment, the chemical etchant that can be used to remove the remaining dense alumina portions 18d comprises a dilute chromic acid mixture.

After removing the dense alumina portions 18d from the structure, a handle substrate 20 is applied to the surface of the copper substrate 10 that includes the ordered array of graphene nanoribbons 12'. The handle substrate 20 can be any material (flexible or non-flexible) including for example, a polymer such as polymethaacylate (PMMA). Other types of materials such as, for example, HD 3007 on a rigid substrate can be used as the handle substrate 20. The handle substrate 20 can be applied to the copper substrate 10 by utilizing any conventional deposition process including, for example, spin-on coating. The thickness of the handle substrate 20 that can be employed in the present disclosure may vary so long as the handle substrate 20 covers the topmost surface of each of the graphene nanoribbons 12'.

Figure 8:
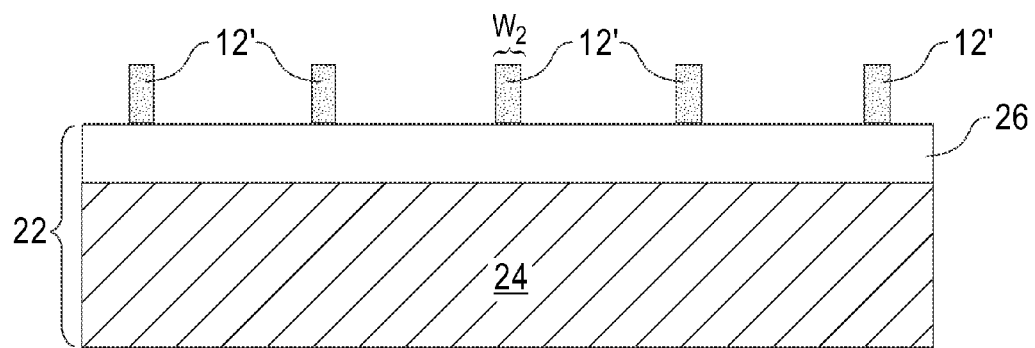
FIG. 8 is a pictorial representation (through a cross sectional view) illustrating the structure of FIG. 7 after removing the copper substrate, transferring the remaining structure to a substrate and removing the handle substrate therefrom.

Referring to FIG. 8, there is illustrated the structure of FIG. 7 after removing the copper substrate 10, transferring the remaining structure to a substrate 22 and removing the handle substrate 20 from the structure so as to expose the graphene nanoribbons 12'. The copper substrate 10 can be removed from the structure shown in FIG. 7 by utilizing a wet etch process in which a chemical etchant that selectively removes the copper substrate 10 relative to the underlying graphene nanoribbons 12' and handle substrate 20 is employed. In one embodiment, the chemical etchant that can be used to remove the copper substrate 10 comprises a ferric chloride solution.

The graphene nanoribbons on the handle substrate 20 are then transferred to substrate 22. In one embodiment, substrate 22 is comprised of a bulk semiconductor material. In another embodiment, and as shown, the substrate 22 can be comprised of a top insulator layer 26 and a bottom semiconductor layer 24. In such an embodiment, an interface is formed between the top insulator layer 26 and the graphene nanoribbons 12'.

The bulk semiconductor and the bottom semiconductor layer can be comprised of any semiconductor material including, for example, Si, SiGe, SiC, SiGeC, GaAs, and InP. The top insulator layer 26 can be comprised of a semiconductor oxide, nitride and/or oxynitride. In one embodiment, the top insulator layer 26 is comprised of silicon oxide and the bottom semiconductor layer is comprised of silicon.

The transfer of the graphene nanoribbons 12' on the handle substrate 20 to substrate 22 can be performed utilizing a bonding process. After the transfer of the graphene nanoribbons 12' to substrate 22, the handle substrate 20 can be removed utilizing, for example, a combination of acetone and isopropyl alcohol in the case of PMMA.

Still referring to FIG. 8, there is shown one exemplary semiconductor structure of the present disclosure which includes an ordered array of graphene nanoribbons located on a surface of a substrate 22, wherein each graphene nanoribbon 12' of the ordered array of graphene nanoribbons has a width, $w_2$, which is less than 10 nm. In one embodiment, the width of each of the graphene nanoribbons 12' within the ordered array is from 4 nm to 9 nm.

It is also noted that the ordered array of graphene nanoribbons is present in a lattice arrangement which mimics that of the dense alumina portions 18d formed during the anodization process as a result of the relative positions of the plurality of pits 16 formed in the pre-patterned aluminum layer 14'. Thus, the ordered array of graphene nanoribbons can be present as a hexagonal arrangement, a square arrangement, a triangular arrangement or hybridized arrangement.

Also, and as shown in FIG. 8, each graphene nanoribbon 12' of the ordered array of graphene nanoribbons has a bottommost surface that is direct contact with a surface portion of the substrate 22, wherein the surface portion of the substrate 22 is coplanar with other surface portions of the substrate not including the graphene nanoribbons 12'.

At this point of the present disclosure, a semiconductor device can be fabricating using the ordered array of graphene nanoribbons as element as the device. For example, a field-effect transistor can be formed by forming a gate dielectric and a gate electrode on portions of the ordered array of graphene nanoribbons. Other portions of the ordered array of graphene nanoribbons can be fabricated to include source and drain contacts of the field-effect transistor.

Reference is now made to FIGS. 9-16 which illustrate another method of the present disclosure. This method of the present disclosure begins by forming the structure shown in FIG. 9. The structure shown in FIG. 9 includes a substrate 30, and a blanket layer of silicon carbide 32 formed on an exposed surface of the substrate 30.

In one embodiment of the present disclosure, the substrate 30 can include a semiconductor material such as, for example, those mentioned above for bottom semiconductor layer 24 of substrate 22. In another embodiment, the semiconductor substrate 30 can include an insulator layer such as for example, sapphire.

The blanket layer of silicon carbide 32 that is formed on the exposed surface of the substrate 30 can be formed utilizing any deposition process. For example, an epitaxial growth process can be used in forming the blanket layer of silicon carbide 32 on the exposed surface of the substrate 30. Other examples of deposition processes that can be used in forming the blanket layer of silicon carbide 32 include chemical vapor deposition or plasma enhanced chemical vapor deposition. Alternatively, and in other embodiments, the blanket layer of silicon carbide 32 can be transferred to the substrate 30 utilizing a conventional layer transfer process.

In one embodiment, the blanket layer of silicon carbide 32 has a thickness from 5 nm to 100 nm. In another embodiment, the blanket layer of silicon carbide 32 has a thickness from 50 nm to 1000 nm.

Figure 9:
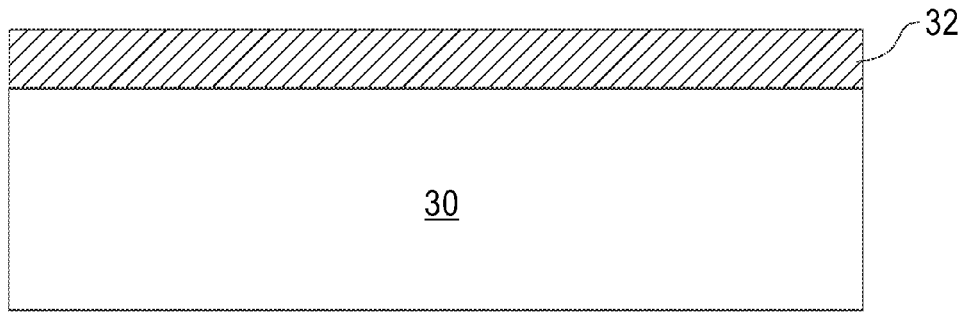
FIG. 9 is a pictorial representation (through a cross sectional view) illustrating a structure including a substrate, and a blanket layer of silicon carbide formed on an exposed surface of the substrate that can be employed in one embodiment of the present disclosure.
Figure 10:
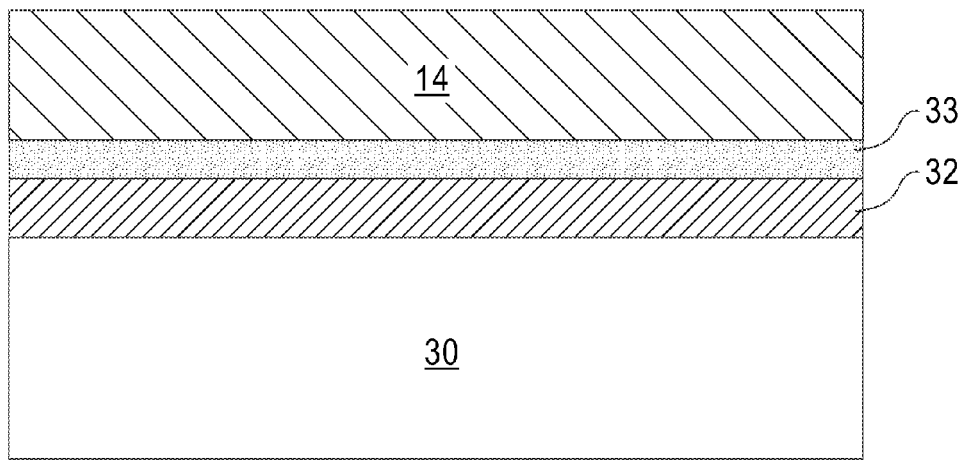
FIG. 10 is a pictorial representation (through a cross sectional view) illustrating the structure of FIG. 9 after forming a blanket layer of titanium on an exposed surface of the blanket layer of silicon carbide and a blanket layer of aluminum on an exposed surface of the blanket layer of titanium.

Referring now to FIG. 10, there is illustrated the structure of FIG. 9 after forming a blanket layer of titanium 33 on an exposed surface of the blanket layer of silicon carbide 32 and a blanket layer of aluminum 14 on an exposed surface of the blanket layer of titanium 33.

The blanket layer of titanium 33 that is present on the exposed surface of the blanket layer of silicon carbide 32 can be formed utilizing any conventional deposition process. Examples of deposition processes that can be used in the present disclosure to form the blanket layer of titanium 33 include, but are not limited to, chemical vapor deposition, atomic layer deposition plasma enhanced chemical vapor deposition, physical vapor deposition, sputtering, plating, chemical solution deposition and electroless plating. In one embodiment, the blanket layer of titanium 33 that can be employed in the present disclosure has a thickness from 3 nm to 10 nm. In another embodiment, the blanket layer of titanium 33 can have a thickness from 5 nm to 50 nm. The blanket layer of titanium 33 can have other thicknesses that are above or below the ranges mentioned above. In this particular embodiment of the present disclosure, the blanket layer of titanium 33 serves as an electrode in a subsequently performed anozidation processing step.

The blanket layer of aluminum 14 can be formed utilizing one of the techniques mentioned above in forming the blanket layer of aluminum in the previously described embodiment of the present disclosure. The thickness of the blanket layer of aluminum 14 used in this embodiment of the present disclosure is within the ranges mentioned above for the blanket layer of aluminum used in the previously described embodiment of the present disclosure.

Figure 11:
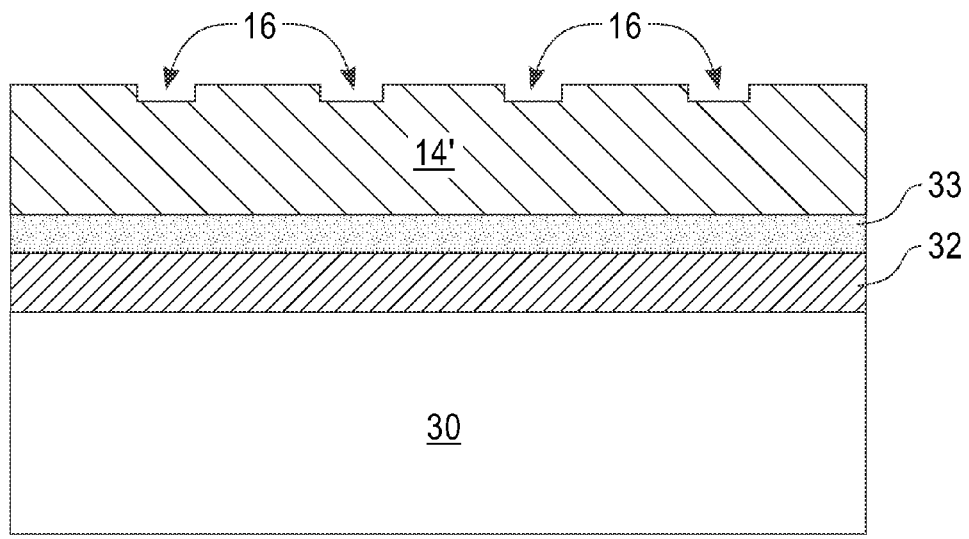
FIG. 11 is a pictorial representation (through a cross sectional view) illustrating the structure of FIG. 10 after pre-patterning the blanket layer of aluminum to form pits within the blanket layer of aluminum that have a desired lattice periodicity.

Referring to FIG. 11, there is depicted the structure of FIG. 10 after pre-patterning the blanket layer of aluminum 14 to provide a pre-patterned blanket layer of aluminum 14' that has a plurality of pits 16 formed that have a desired lattice periodicity. The formation of the pits 16 within the blanket layer of aluminum includes one of the techniques mentioned for forming the structure shown in FIG. 3.

Figure 12:
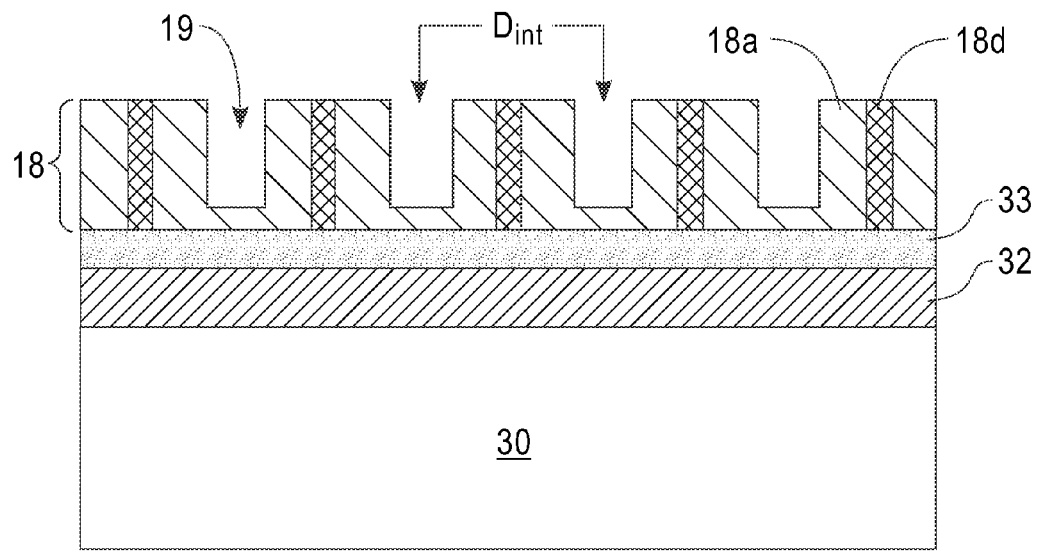
FIG. 12 is a pictorial representation (though a cross sectional view) illustrating the structure of FIG. 11 after converting the pre-patterned blanket layer of aluminum into a layer of porous anodized alumina.

Referring now to FIG. 12, there is illustrated the structure of FIG. 11 after converting the pre-patterned blanket layer of aluminum 14' into a layer of porous anodized alumina 18. The converting is performed utilizing the Al anodization process described above for forming the structure shown in FIG. 4 of the present disclosure. The layer of porous anodized alumina 18 comprises a plurality of pores 19 which are surrounded by two distinct oxides of aluminum, i.e., amorphous alumina portions 18a and dense alumina portions 18d. These two distinct oxides of aluminum and pores 19 formed in this embodiment can have any of the characteristics/properties mentioned above in forming the structure shown in FIG. 4. In some embodiments, the dense alumina portions 18d can have a sub-10 nm width at this point of the present disclosure. Alternatively, the sub-10 nm width within the dense alumina portions is provided after removing the amorphous alumina portions from the layer of porous anodized alumina.

Figure 13:
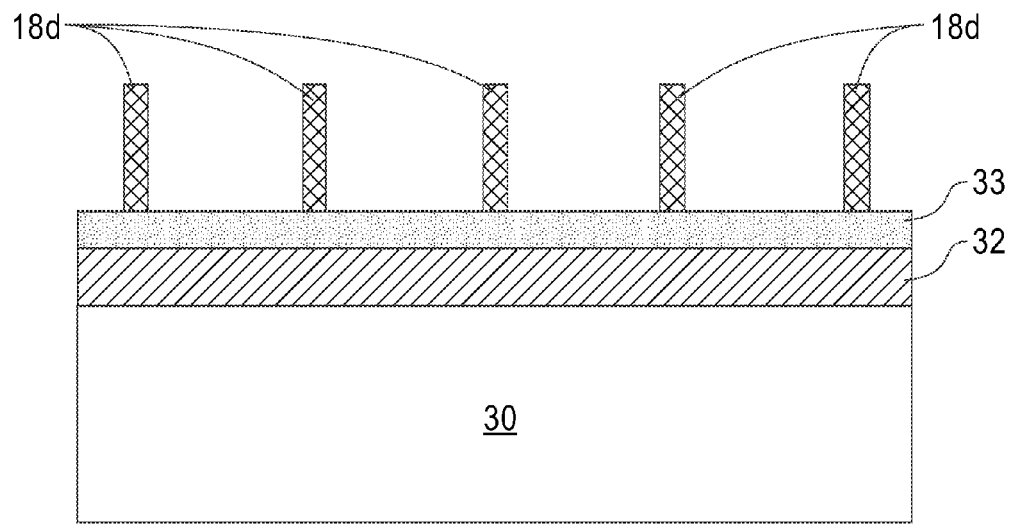
FIG. 13 is a pictorial representation (though a cross sectional view) illustrating the structure of FIG. 12 after removing amorphous portions of the layer of porous anodized alumina, while maintaining dense alumina portions that have a sub-10 nm width.

Referring to FIG. 13, there is illustrated the structure of FIG. 12 after removing the amorphous portions 18a of the layer of porous anodized alumina 18, while maintaining the dense alumina portions 18d that have a sub-10 nm width and an ordered lattice arrangement. The removal of the amorphous alumina portions 18a includes one of the techniques mentioned above for forming the structure shown in FIG. 5.

Figure 14:
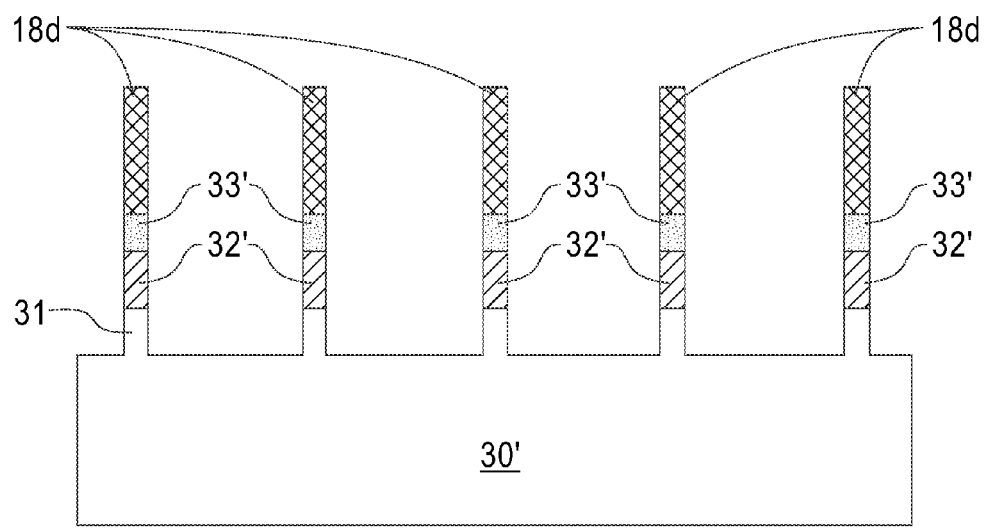
FIG. 14 is a pictorial representation (though a cross sectional view) illustrating the structure of FIG. 13 after etching exposed portions of the blanket layer of titanium and at least underlying portions of the blanket layer of silicon carbide forming a silicon carbide lattice using the dense alumina portions of the layer of porous anodized alumina as an etch mask.

Referring to FIG. 14, there is illustrated the structure of FIG. 13 after etching exposed portions of the blanket layer of titanium 33 and at least underlying portions of the blanket layer of silicon carbide 32 forming patterned titanium portions 33' and an underlying silicon carbide lattice made of individual silicon carbide portions 32' using the dense alumina portions 18d of the layer of porous anodized alumina 18 as an etch mask. The silicon carbide lattice that is formed has a same lattice arrangement as that of the pores formed into the blanket layer of aluminum by the anozidation process. The width of each individual silicon carbide portion 32' of the lattice of silicon carbide portions is the same as that of the dense alumina portions 18d. In this step of the present disclosure, a single etch or a plurality of etching steps can be used to transfer the pattern from the etch mask into the underlying layers of titanium and silicon carbide. In one embodiment, reactive ion etching can be used to provide the structure illustrated in FIG. 14. In another embodiment, a chemical wet etching process can be used in providing the structure illustrate in FIG. 14. In a further embodiment, a combination of dry etching and/or wet etching can be employed in providing the structure shown in FIG. 14.

Figure 15:
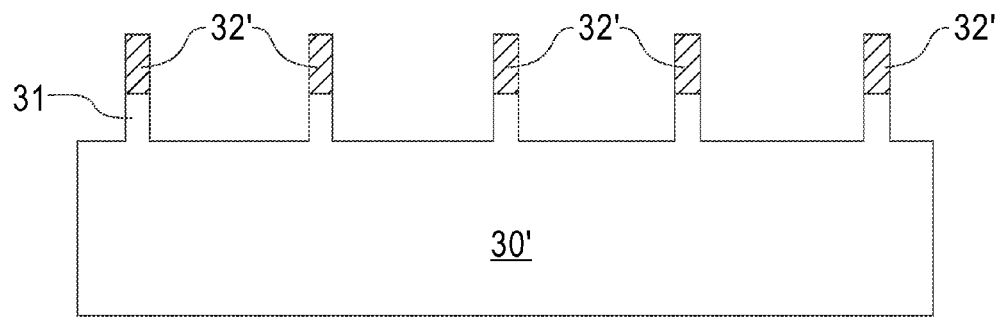
FIG. 15 is a pictorial representation (though a cross sectional view) illustrating the structure of FIG. 14 after removing the dense alumina portions of the layer of porous anodized alumina and the remaining portions of the blanket layer of titanium from the structure.

Referring now to FIG. 15, there is illustrated the structure of FIG. 14 after removing the dense alumina portions 18d of the layer of porous anodized alumina 18 and the remaining portions of the blanket layer of titanium (i.e., patterned titanium portions 33') from the structure. The removal of the dense alumina portions 18d may be performed utilizing the same etch mentioned above for removing the same material from the structure in FIG. 6. The underlying patterned titanium portions 33' can be then be removed utilizing an etching process that selectively removes titanium. For example, Titanium Etchant TFT (Transene Company, Inc.) can be used to remove the remaining patterned titanium portions 33' from the structure. The structure shown in FIG. 15 includes silicon carbide portions 32' that each has a bottommost surface that is direct contact with a surface portion of substrate 30', wherein the surface portion of the substrate 30' is vertically offset from other surface portions of the substrate 30' not including the silicon carbide portions 32'. The surface portion including the silicon carbide portions 32' includes pillar portions 31 that connect each surface portion of the substrate including a silicon carbide portion 32' to a remaining portion of the substrate.

Figure 16:
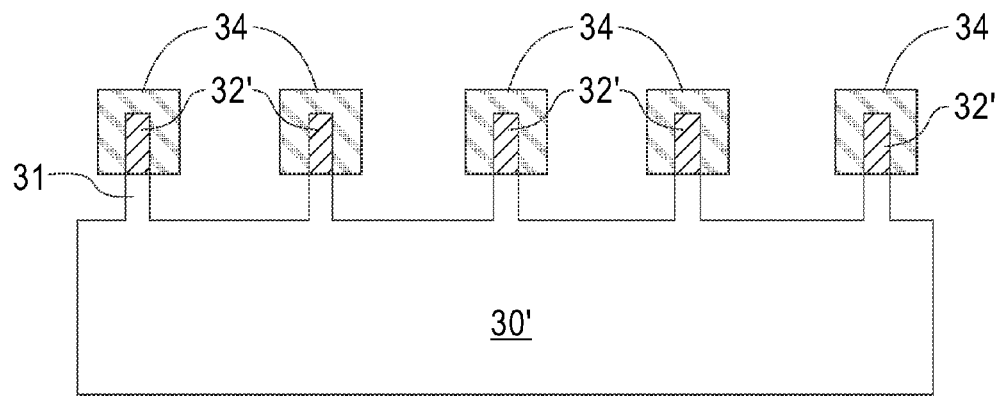
FIG. 16 is a pictorial representation (though a cross sectional view) illustrating the structure of FIG. 15 after forming a layer of graphene on exposed surfaces of each silicon carbide lattice.

Referring to FIG. 16, there is illustrated the structure of FIG. 15 after forming a layer of graphene 34 on exposed surfaces of each silicon carbide portion 32'. The layer of graphene 34 can be formed utilizing one of the techniques mentioned above for forming the blanket layer of graphene 14. In this embodiment, the selective deposition occurs only on exposed surfaces of the silicon carbide portions 32'.

In this embodiment and as shown in FIG. 16, a semiconductor structure is provided that includes an ordered array of silicon carbide portions located on a surface of a substrate 30', wherein each silicon carbide portion 32' of the ordered array of silicon carbide portions has a width which is less than 10 nm. Also, the structure includes a layer of graphene 34 located on a topmost surface of each silicon carbide portion 32', wherein each layer of graphene 34 has a width of less than 10 nm. In one embodiment, the width of each layer of graphene 34 is from 4 nm to 9 nm.

In the illustrated structure, each layer of graphene 34 represents a graphene nanoribbon within an ordered array. The ordered array of graphene nanoribbons can have a hexagonal arrangement, a square arrangement, a triangular arrangement or a hybridized arrangement. Also, in this embodiment, each layer of graphene 34 has a portion present on sidewall surfaces of each silicon carbide portion 32'. In some embodiments, not shown, a mask can be formed which prevents graphene to grow on the exposed sidewalls of each silicon carbide portion.

At this point of the present disclosure, a semiconductor device can be fabricating using the ordered array of graphene nanoribbons as element as the device. For example, a field effect transistor can be formed by forming a gate dielectric and a gate electrode on portions of the ordered array of graphene nanoribbons. Other portions of the ordered array of graphene nanoribbons can be fabricated to include source and drain contacts of the field effect transistor.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:
    forming a blanket layer of graphene on an exposed surface of a copper substrate;
    forming a blanket layer of aluminum on an exposed surface of the blanket layer of graphene;
    pre-patterning the blanket layer of aluminum to form a plurality of regularly spaced pits within the blanket layer of aluminum;
    converting the pre-patterned blanket layer of aluminum having said plurality of regularly spaced pits into a layer of porous anodized alumina, said layer of porous anodized alumina comprising a plurality of alumina portions of a first density and having an ordered lattice arrangement, and amorphous alumina portions of a second density that are adjacent to said alumina portions of the first density, wherein said first density is greater than the second density;
    removing the adjacent amorphous alumina portions from said layer of porous anodized alumina, wherein the remaining plurality of alumina portions each has a width of less than 10 nm;
    removing exposed portions of the blanket layer of graphene using said plurality of alumina portions as an etch mask to provide a graphene lattice comprising an ordered array of graphene nanoribbons, each graphene nanoribbon within said ordered array having a width of less than 10 nm;
    removing said etch mask; and
    transferring said ordered array of graphene nanoribbons to a substrate.

2. The method of claim 1, wherein said forming the blanket layer of graphene comprises chemical vapor deposition.

3. The method of claim 1, wherein said forming the layer of aluminum comprises atomic layer deposition.

4. The method of claim 1, wherein said pre-patterning said blanket layer of aluminum comprises nanoimprintation or interference lithography and etching.

5. The method of claim 1, wherein said converting the pre-patterned blanket layer of aluminum comprises anozidation at a potential from 8 Volts to 500 Volts.

6. The method of claim 1, wherein each of alumina portions having said first density has a bottommost surface in contact with an uppermost surface of said blanket layer of graphene.

7. The method of claim 1, wherein said removing the adjacent amorphous alumina portions comprises etching with an acid.

8. The method of claim 7, wherein said acid comprises dilute phosphoric or chromic acid.

9. The method of claim 1, wherein the removing the exposed portions of the blanket layer of graphene comprises etching with an oxygen plasma.

10. The method of claim 1, wherein said removing said etch mask comprises a wet etch process.

11. The method of claim 1, wherein said transferring the ordered array of graphene nanoribbons to the substrate comprises:
   applying a transfer substrate to a surface of said copper substrate that includes said ordered array of graphene nanoribbons located thereon;
   removing the copper substrate;
   bonding exposed portions of each of said graphene nanoribbons of said ordered array of graphene nanoribbons to an exposed surface of the substrate; and
   removing said transfer substrate.

12. The method of claim 1, wherein said copper substrate comprises a copper foil.

* * * * *